United States Patent [19]

Dellantonio

[11]  4,226,128
[45]  Oct. 7, 1980

[54] FRICTION DEVICE FOR USE IN CAR RADIOS

[75] Inventor: Ezio F. Dellantonio, Rome, Italy

[73] Assignee: Autovox S.p.A., Rome, Italy

[21] Appl. No.: 896,122

[22] Filed: Apr. 13, 1978

[30] Foreign Application Priority Data

Apr. 15, 1977 [IT] Italy .............................. 48980 A/77
Aug. 10, 1977 [IT] Italy .............................. 50625 A/77

[51] Int. Cl.² ............................................. F16H 35/18
[52] U.S. Cl. .................................. 74/10 R; 74/10.33; 74/89
[58] Field of Search ................ 74/10 R, 10.27, 10.33, 74/10.37, 89, 89.11, 89.12, 89.13, 89.17

[56] References Cited

U.S. PATENT DOCUMENTS

| | | | |
|---|---|---|---|
| 2,451,032 | 10/1948 | Kingman | 74/10 |
| 2,808,506 | 10/1957 | Skwareh | 74/10.39 |
| 3,431,884 | 3/1967 | Marantz | 74/10 |
| 3,503,270 | 3/1970 | Chashi | 74/10.33 |
| 3,724,280 | 4/1973 | Olah | 74/10.33 |
| 3,906,806 | 9/1975 | Harlan | 74/10.33 |
| 4,033,491 | 7/1977 | Aldenhoven | 74/89 |
| 4,099,421 | 6/1978 | Ohashi et al. | 74/10.33 |
| 4,106,351 | 8/1978 | Santoro | 74/10.33 |

FOREIGN PATENT DOCUMENTS 46-17686 5/1971 Japan .................................... 74/10.33

*Primary Examiner*—Ira S. Lazarus
*Attorney, Agent, or Firm*—James W. Gillman; Phillip H. Melamed

[57] ABSTRACT

A friction device for coupling the manual tuning knob of a keyboard (pushbutton) radio to a reciprocal tuning slidebar is disclosed. The friction device comprises a cylindrical rod attached to the tuning slidebar which selectively is drivingly engaged by a peripheral V-shaped groove in a pulley rotated by the manual tuning knob.

15 Claims, 4 Drawing Figures

FRICTION DEVICE FOR USE IN CAR RADIOS

BACKGROUND OF THE INVENTION

This invention relates to a friction device for use in car radios.

Car radios usually have a tuning slider which carries the cores of the variable-inductance coils of the local oscillator of the tuning device, thereby a tuning frequency change is obtained by correspondingly moving the tuning slider in its axial direction. The user may move the tuning slider by means of a convenient rotatable knob.

Furthermore, it is known to provide car radios, in addition to the conventional tuning knob, with keyboard type tuning devices in which each preselection key of a keyboard corresponds to a different transmitter station to which the key can be preset, whereby the radio can be tuned to said station by simply depressing this key. Such tuning devices generally employ a friction clutch, which is interposed between the tuning knob and the tuning slider and has to be released to disengage the manual knob control, when tuning is effected by using the keyboard in lieu of the knob.

A known type of such a releasable friction clutch employs a friction element with a high coefficient of friction, such as rubber, cork of the like. Therefore, the tuning devices of this known type of clutch have in general the disadvantage that the changes in tuning brought about by the rotation of the knob are non uniform, since the friction element of the clutch has a certain elasticity. Consequently, the tuning accuracy in these tuning devices is limited.

Furthermore, these known friction clutches are relatively cumbersome, because the friction element must be sufficiently large to transmit the torque necessary for moving the tuning slider.

SUMMARY OF THE INVENTION

An object of the present invention is to provide a friction device which is extremely small and still very accurate and uniform in the transmission of the motion from the tuning knob to the slider.

According to the invention there is provided a friction device comprising a reciprocable element secured to the tuning slider and a rotatable element driven by the tuning knob, said elements being releasably urged against each other into frictional contact and their surfaces of mutual contact being shaped in such a manner that the surface of one element is wedged into the surface of the other element.

This device converts therefore the rotational motion of the rotatable element into a rectilinear motion of the reciprocable element and consequently also of the tuning slider secured to it, without the need of any intermediate means. In fact, the wedging of one element into the other eliminates the need of the interposition of high friction coefficient materials between the driving and the driven element.

The device of the present invention is particularly but not exclusively suitable for the control of the transducers used in the tuning devices of radio sets, since it allows a fine and sensitive search of transmitter stations.

The friction device according to the invention is particularly suitable for use in car radios because it occupies a relatively small volume, an important factor in the design of car radios, since the space available for the installation of a radio in car dashboards is usually at a premium.

Preferably the reciprocable element is a rod and the rotatable element a pulley. The rod may have a circular cross-section and the pulley a V-shaped groove. These two elements of the device may be urged against each other by any suitable means, such as a roller resiliently biased against the reciprocable element.

In general the tuning slider moves between two end stops which determine two positions which correspond to the two limits of the frequency range of the radio set. Consequently also the rod, which is secured to said slider, stops when either end stop of the slider is reached. If the knob is inadvertently rotated after either of these two end stops has been reached by the slider, the pulley driven by said knob will continue rotating on the corresponding end of the rod and will wear it thinner.

This wear results in an irregular jerky motion of the tuning slider when they are moved back, preventing an accurate tuning-in to a station near the ends of the tuning scale.

When then the wear at the rod ends becomes very severe, the friction between them and the pulley may become insufficient to remove the rod from its end positions.

This disadvantage has been overcome according to another aspect of this invention by providing the cylindrical rod with at least one conical end portion.

The rod may be pivotally connected to an element controlling the tuning slider and may have a single conical end portion when spring means are provided to urge it in a predetermined direction.

BRIEF DESCRIPTION OF THE DRAWINGS

Three embodiments of the invention will now be described for a purely illustrative and in no way limitative purpose with reference to the accompanying draings, in which.

DESCRIPTION OF THE PREFERRED EMBODIMENTS

Figure 1:
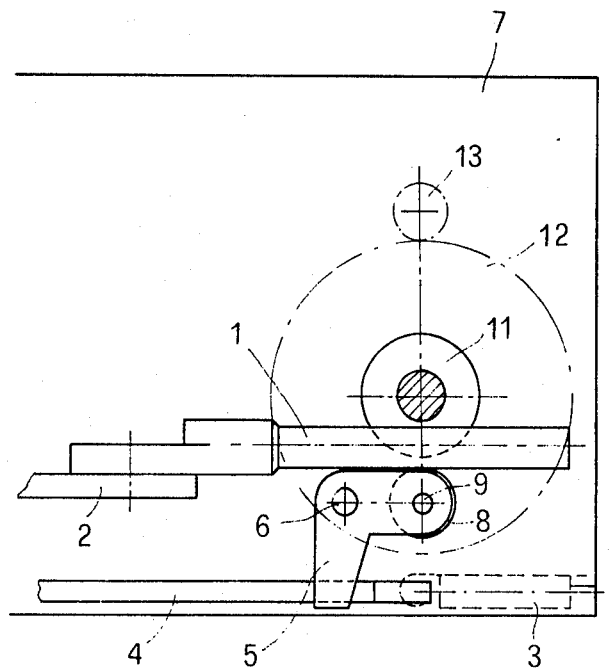
FIG. 1 is a diagrammatic front view of a device according to a first embodiment of the invention.

Referring to the drawings, and in particular to FIG. 1, a friction device according to the invention is shown mounted on a frame 7 of a car radio.

Figure 2:
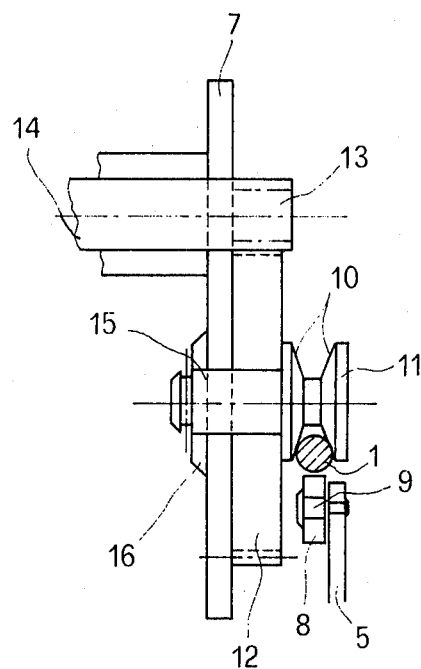
FIG. 2 is a side view of the device of FIG. 1.

A rotatable element of the friction device consists of a pulley 11 having two flanges 10 defining a circumferential groove having a V-section (FIG. 2).

A reciprocable element, in the form of a cylindrical rod 1, is resiliently wedged between the flanges 10 of the pulley 11 by a small roller 8, freely rotatable around a pivot pin 9 and engaging the external surface of the rod 1.

The pivot pin 9 is rigid with one arm of a bellcrank lever 5, fulcrumed on a pivot pin 6 integral with the frame 7.

In order to engage the friction device, the bellcrank lever 5 is urged anticlockwise, as viewed in FIG. 1, around the pivot pin 6, by a movable bar 4, which is biased axially by a helical spring 3, one end of which is fixed to the bar 4 and the other end of which is anchored to the frame 7.

When the friction device has to be disengaged, it suffices to move the bar 4 axially (to the left as viewed in FIG. 1) against the action of the spring 3: such movement disengages the rod 1 from the flanges 10 of the pulley 11, so that the pulley 11 ceases to be coupled to the rod 1.

As known, the bar 4 is generally shifted to disengage the friction device each time a preselection key is actuated.

The pulley 11 is rigidly connected to a gear 12, which meshes with a pinion 13 integral with the shaft 14 of the tuning knob (not shown).

The rod 1 is connected to an element 2 which controls a conventional tuning slider, so that a rotation of the pulley 11 by means of the tuning knob causes the tuning slider to move to the right or to left, as viewed in FIG. 1, to tune-in a desired transmitter station.

The tuning shaft 14 is supported by the frame 7 and, in addition to its rotation about its axis, the shaft 14 is capable of an inward axial movement in order to release a previously depressed preselection key, thereby engaging the friction device and permitting a manual search of a transmitter station.

The pulley 11 and the gear 12 are rigid with a shaft 15, rotatable in the frame 7 about an axis parallel to that of the tuning shaft 14.

In order to avoid that the rod 1 may transmit motion to the pulley 11, for instance by a spring acting on said rod 1 or on the tuning slider, the gear 12 is pressed against the frame 7 by a spring 16 in the form of a belleville washer or spider.

The friction between the gear 12 and the frame 7 can be increased by interposing between them a washer of a suitable material, such as cardboard or fibre.

As already stated, the wedging of the rod 1 between the flanges 10 of the V-shaped groove of the pulley 11 ensures the maximum positive transmission of motion from the pulley 11 to the rod 1 and therefore a very smooth rectilinear motion of the rod 1 and consequently a very accurate setting of the tuning slider.

This wedging action permits that both the pulley 11 and the rod 1 can be made of metal, although keeping within the usual limits the pressure applied by the roller 8.

In operation, when the bar 4 comes under the action of the spring 3, it rotates the bellcrank lever 5 anticlockwise thereby to wedge the rod 1 between the flanges 10, so that by rotating the tuning knob the pinion 13 drives the gear 12 and thus rotates the pulley 11 to displace the rod 1 and therefore the tuning slider axially by an amount precisely related to the rotation of the tuning knob.

When it is desired to release the friction device, for instance in order to effect tuning by means of a preselection key, the depression of the selected key causes a shifting of the bar 4, to the left as viewed in FIG. 1, against the action of its biasing spring 3, thereby drawing the roller 8 away from the rod 1 and disengaging the rod 1 from the pulley 11. The rod 1, together with the tuning slider secured to it, is thereby left free to move axially.

It will be understood that the rod 1 can have any cross-sectional shape, such as a triangular, polygonal or other shape.

In particular, if the rod 1 has a V-shaped cross-section, the rotatable element could have the shape of a disc with rounded edges.

Figure 3:
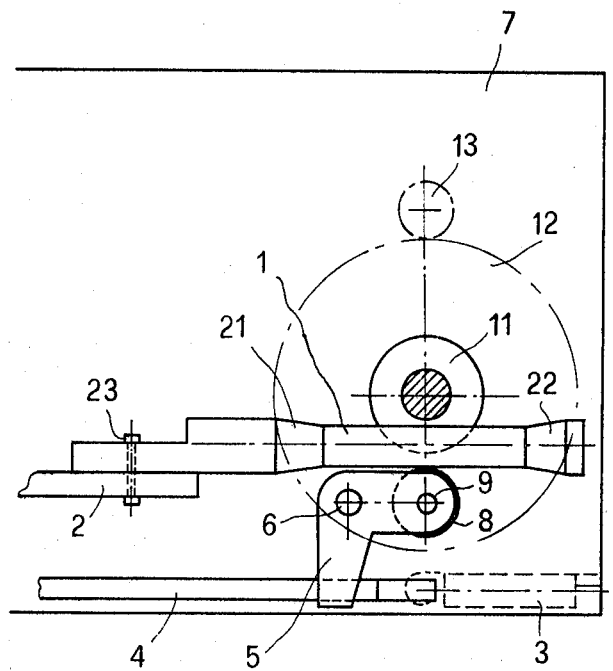
FIG. 3 is a diagrammatic front view of a device according to a second embodiment of the invention.

In the embodiment of FIG. 3 the cylindrical rod 1 is provided with two conical end portions 21, 22.

The tuning slider is designed in such a manner as to permit it to move beyond the scale ends, where the conical end portions 21, 22 of the rod 1 enter the groove of the pulley 11.

In this way only the cylindrical portion of the rod 1 serves for the tuning control.

Owing to their greater thickness, it takes these conical portions a longer time to be worn so thin as to render their frictional engagement with the pulley groove insufficient to move the rod.

As long as the conical end portions 21, 22 are not worn thinner than the cylindrical portion by the pulley 11, the motion of the rod 1 remains uniform. In this way, the life time of the present device is notably extended.

Furthermore, even if the contact portion beteween the conical portion or portions and the pulley groove does not produce a uniform motion of the rod 1, this is of no importance because this portion or portions are outside the scale ends.

It will be noted that the rod 1 is pivoted to the element 2 which controls movement of or forms part of the tuning slider, through a pivot pin 23: this pivotal connection allows a better relative positioning between the moving parts.

Figure 4:
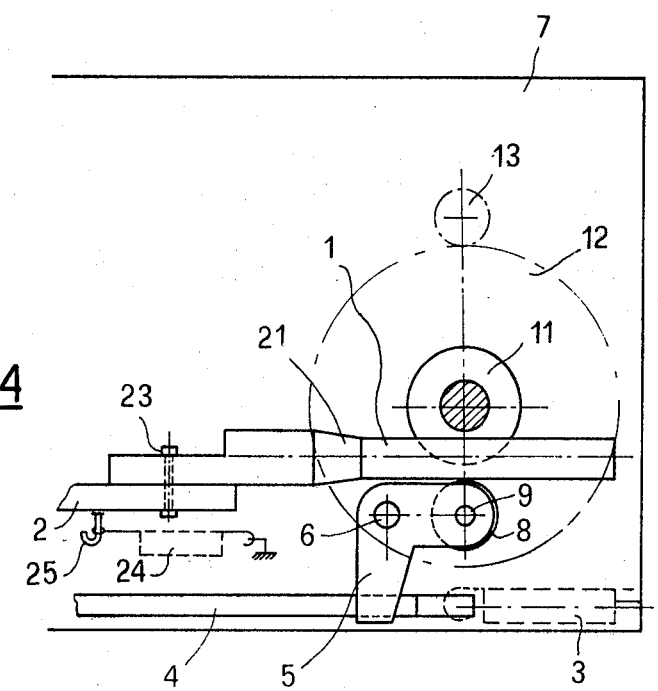
FIG. 4 is a diagrammatic front view of a device according to a third embodiment of the invention.

A rod 1 with only one conical end portion 21 is shown in FIG. 4.

A tension spring 24 has one end fixed to a hook 25 fastened to the control element 2 and the other end anchored to the frame 7.

In this way the spring 24 biases the element 2 and therefore the rod 1 towards the right as viewed in FIG. 4, that is away from any worn right terminal portion, in which no friction between the pulley 11 and said rod end could take place and consequently a rotation of the pulley 11 would no more cause a rectilinear motion of the rod. Thanks to the provision of this spring 24 only one end of the rod 1 need be made conical, namely that opposite the direction of the bias exerced by said spring.

It will be noted that the bias action, as caused by the spring 24, could be also produced by a tension spring having one end anchored to the frame 7 and the other end directly connected to the rod 1 or to the tuning slider.

It will be apparent that other numerous and different variations can be made by those skilled in the art to the disclosed forms of embodiment, without departing from the scope of this invention.

I claim:

1. A friction device for use in car radios in which a frame carries a conventional tuning slider, a tuning knob and a keyboard of keys for the preselection of transmitter stations, wherein the improvement comprises: a reciprocable element secured to the tuning slider; and a rotatable element driven by the tuning knob, said elements being releasably urged against each other into frictional contact and their surfaces of mutual contact being shaped in such a manner that the surface of one element is wedged into the surface of the other element.

2. A device according to claim 1, in which said reciprocable element is a rod and said rotatable element is a grooved pulley.

3. A device according to claim 2, in which said rod has a circular cross-section and said pulley has a V-shaped groove.

4. A device according to claim 1, in which said elements are urged against each other by a rotatable roller resiliently biased against the reciprocable element.

5. A device according to claim 3, in which said cylindrical rod has at least one conical end portion.

6. A device according to claim 3, in which said cylindrical rod has conical portions at both ends.

7. A device according to claim 5, in which spring means are provided to bias the rod in the direction in which said conical end portion is drawn towards the area of contact with said pulley.

8. A device according to claim 5, in which spring means are provided to bias the tuning slider in the direction in which said conical end portion is drawn towards the area of contact with said pulley.

9. A device according to claim 5, in which spring means are provided to bias an element controlling the tuning slider in the direction in which said conical end portion is drawn towards the area of contact with said pulley.

10. A device according to claim 1, in which said reciprocable element is pivotally connected to an element controlling the tuning slider.

11. A device according to claims 2 or 3 which includes a gear coupling said tuning knob to said grooved pulley, and which includes a spring means coupling the gear to the frame to inhibit the rod from transmitting motion to the pulley.

12. A device according to claims 1, 2 or 3 wherein said elements are releasably urged against each other by a pivotal lever selectively biasing said elements into engagement.

13. A device according to claim 12 wherein the movement of said pivotal lever is controlled by an axially moveable bar which is axially biased by a spring, the axial position of said bar determining the pivotal position of said lever which in turn determines whether said elements are brought into driving frictional contact with each other.

14. A device according to claims 1, 2 or 3 wherein said tuning knob is rotatable about an axis which is parallel to the axis about which said rotatable element is driven by the tuning knob.

15. A device according to claims 1, 2 or 3 wherein at least one of said elements is made of metal.

* * * * *